(12) United States Patent
Bloeβ et al.

(10) Patent No.: US 7,358,491 B2
(45) Date of Patent: Apr. 15, 2008

(54) METHOD AND APPARATUS FOR THE DEPTH-RESOLVED CHARACTERIZATION OF A LAYER OF A CARRIER

(75) Inventors: Harald Bloeβ, Radebeul (DE); Ulrich Mantz, Dresden (DE)

(73) Assignee: Infineon Technologies AG, Munich (DE)

( * ) Notice: Subject to any disclaimer, the term of this patent is extended or adjusted under 35 U.S.C. 154(b) by 418 days.

(21) Appl. No.: 11/196,513

(22) Filed: Aug. 4, 2005

(65) Prior Publication Data

US 2006/0076494 A1    Apr. 13, 2006

(30) Foreign Application Priority Data

Oct. 11, 2004    (DE) .................... 10 2004 049 518

(51) Int. Cl.
*G01N 23/00*    (2006.01)
(52) U.S. Cl. ................ 250/309; 250/492.2; 250/492.3; 250/492.21; 250/307; 250/310
(58) Field of Classification Search ................ 250/309, 250/492.2, 492.3, 492.21, 307, 310; 438/4; 216/37, 66
See application file for complete search history.

(56) References Cited

U.S. PATENT DOCUMENTS 6,268,608 B1 * 7/2001 Chandler ................. 250/492.2
6,414,307 B1    7/2002 Gerlach et al.
6,649,919 B2    11/2003 Chao et al.
6,794,663 B2    9/2004 Shichi et al.

FOREIGN PATENT DOCUMENTS

RU    2229115    *    5/2004

OTHER PUBLICATIONS

P. Gnauck et al., (Mar. 2002) "A New CrossBeam Inspection Tool Combining an Ultrahigh Resolution Field Emission SEM and a High Resolution FIB," Proceedings of the SPIE—The International Society for Optical Engineering Vo. 4689, pp. 833-840.

* cited by examiner

*Primary Examiner*—Robert Kim
*Assistant Examiner*—Michael Maskell
(74) *Attorney, Agent, or Firm*—Patterson & Sheridan, L.L.P.

(57) ABSTRACT

The present invention relates to a method for the depth-resolved characterization of a layer of a carrier. This involves firstly producing a cutout in the layer of the carrier with a sidewall and subsequently removing carrier material adjoining the sidewall with the aid of an ion beam. During the removal process, images of the sidewall are recorded and material compositions of the removed carrier material are determined as well. A depth-resolved characterization of the layer of the carrier is carried out on the basis of a correlation of the determined material compositions of the removed carrier material with the recorded images of the sidewall, layer depths being assigned to the material compositions of the removed carrier material with the aid of the images of the sidewall. The invention furthermore relates to an apparatus for carrying out this method.

11 Claims, 2 Drawing Sheets

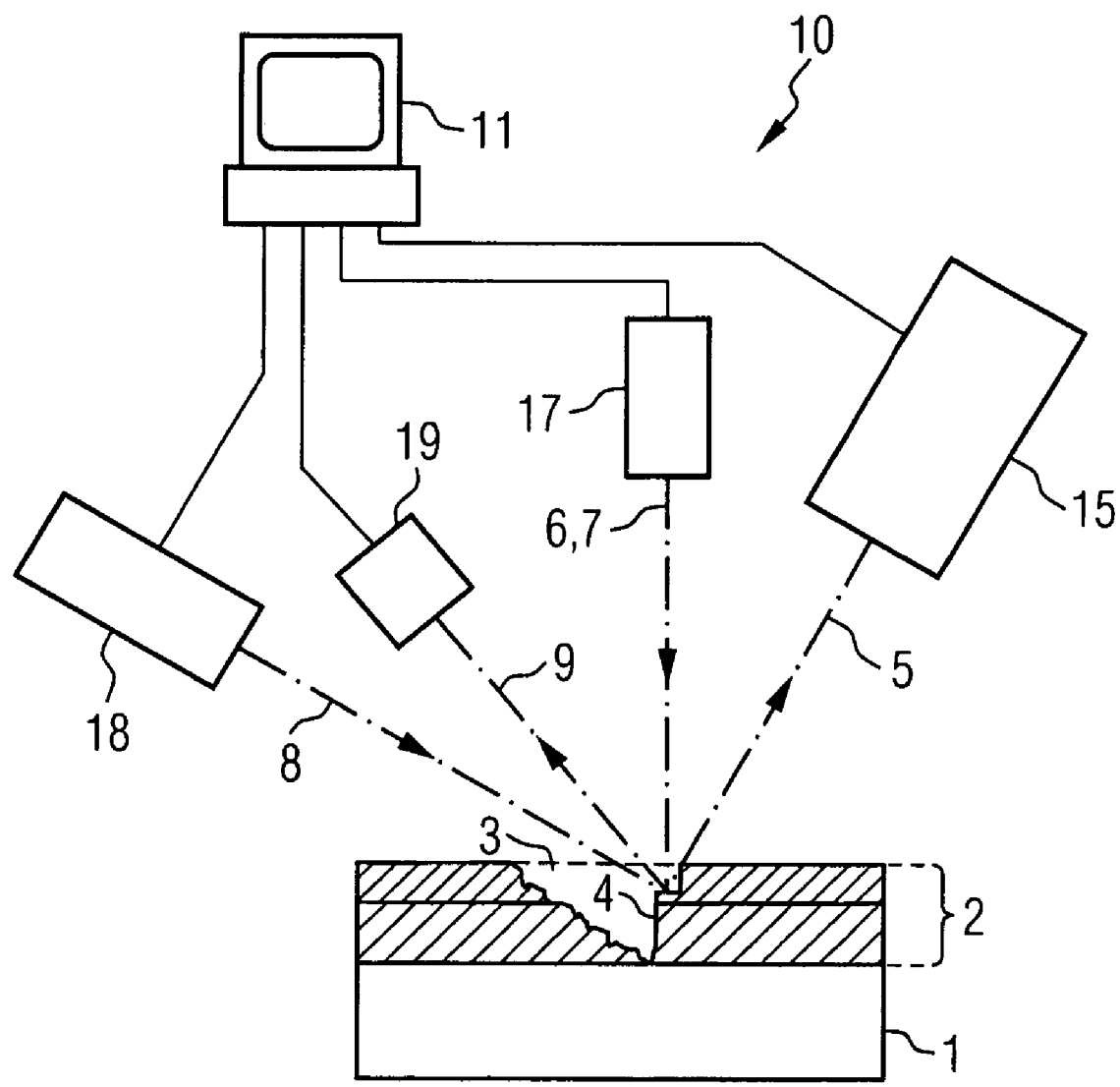

METHOD AND APPARATUS FOR THE DEPTH-RESOLVED CHARACTERIZATION OF A LAYER OF A CARRIER

CLAIM FOR PRIORITY

This application claims the benefit of priority to German Application No. 10 2004 049 518.1 which was filed in the German language on Oct. 11, 2004, the contents of which are hereby incorporated by reference.

TECHNICAL FIELD OF THE INVENTION

The present invention relates to an apparatus and method for the depth-resolved characterization of a layer of a carrier.

BACKGROUND OF THE INVENTION

Microelectronic semiconductor components with integrated circuits nowadays form the basis for all kinds of electronic applications. These components comprise a complex arrangement of electronic structures which are connected up to one another in a plurality of planes arranged one above the other on a carrier substrate referred to as a chip. The joint production of chips on a substrate slice, also referred to as a wafer, is distinguished by a complicated sequence of a multiplicity of different production steps.

One important production step is so-called implantation doping or doping of a wafer. This is understood to be the targeted introduction of impurities or impurity atoms into a layer of a wafer in order to alter the properties thereof, for example the electrical conductivity and the conductivity type, in a defined manner. Electronic properties are defined for the later semiconductor components in this way.

One of the principal objectives of the semiconductor industry is to continuously increase performance by means of ever faster circuits, this being linked with continuous miniaturization of the electronic structures. However, the production of smaller structures with electrical properties virtually remaining the same imposes stringent requirements on the precision and the reliability of the production processes used. At the same time, it is necessary to rely on exact supervisory methods in order to accurately monitor the production processes.

Methods for the depth-resolved characterization of a layer of a wafer are of great significance in this case. Methods of this type are used in particular for determining a depth profile of a dopant concentration in order subsequently to check doping processes carried out on a wafer.

One known method for determining a doping profile of a layer of a wafer is based on the measurement of spreading resistances of a surface, which is referred to as spreading resistance profiling (SRP). In this method, the wafer is firstly broken in a layer region of interest and insipiently ground at an oblique angle with respect to the layer surface in order to produce an oblique ground face penetrating through the layer. Afterward, by means of two measuring tips placed onto the ground face, spreading resistances are in each case measured between linearly arranged measurement points which are at a constant distance from one another. In this case, the spreading resistances are dependent on the material properties and thus on the respective dopant concentration. In this way, it is possible to establish a depth profile of a dopant concentration.

However, the requisite breaking and insipient grinding of the wafer mean that this method is complicated and laborious. Furthermore, the wafer is thereby destroyed, as a result of which the method is cost-intensive, on the one hand, and, on the other hand, can only be employed "offline" on a small number of test wafers, and in particular not on product wafers. The consequence of this is that the measurement results may not be representative. Furthermore, the method has a relatively poor lateral spatial resolution in the mm to μm range since the spreading resistances are measured along the obliquely extending ground face. Consequently, it is not possible to determine a doping profile in a region of an individual later component in a targeted manner.

A further method used for the depth-resolved characterization of a layer of a wafer is so-called secondary ion mass spectrometry (SIMS). This involves bombarding the surface of the wafer in a layer region of interest with a primary ion beam, thereby producing a cutout in the surface with removal of semiconductor material or particles. In this case, up to about 10% of the removed particles are ionized and are referred to as secondary ions. During the removal process, the secondary ions are fed to a mass spectrometer, where they are subjected to an analysis, as a result of which dopant concentrations, in particular, are determined in temporally resolved fashion. After the removal process has been carried out, the final depth of the cutout is determined, so that it is possible, taking account of the total measurement time, to assign layer depths to the dopant concentrations recorded during the removal process. A depth profile of a dopant concentration is established in this way.

Compared with the above-described method based on the measurement of spreading resistances, secondary ion mass spectrometry has the advantage that the wafer examined is not destroyed completely, but rather only locally in a limited region, and can consequently be processed further after the removal process. Therefore, secondary ion mass spectrometry is also suitable for the "inline" measurement of product wafers.

What is problematic, however, is that the speed of material removal is dependent on the respective dopant concentration. Consequently, it is possible that the assignment of layer depths to the dopant concentrations respectively recorded, said assignment being based on an essentially constant removal speed, is inaccurate and, consequently, the established depth profile of the dopant concentration is not exact. Therefore, a doping profile obtained in this way may be only poorly suited to assessing doping processes carried out on a wafer. Furthermore, with the aid of secondary ion mass spectrometry, too, it is possible to obtain only a relatively low lateral spatial resolution in the μm range.

The so-called eddy current measuring method can be used for the completely nondestructive determination of a doping profile of a layer of a wafer. In this case, a varying magnetic field is generated by means of a coil and induces eddy currents in the surface of the wafer to be examined. For their part, the eddy currents generate inherent magnetic fields which interact with the (primary) magnetic field of the coil. By measuring a resultant change in resistance or inductance of the coil, it is possible to obtain information about material properties and thus about the dopant concentration.

What is disadvantageous, however, is that the eddy current measuring method has only a very inaccurate lateral spatial resolution and, therefore, may have to be correlated with one of the methods described above. A further disadvantage is that the induced eddy currents flow only in a relatively small depth of the wafer, as a result of which, the method furthermore has a relatively small information depth.

SUMMARY OF THE INVENTION

The present invention provides an improved method and apparatus which enable a depth-resolved characterization of a layer of a carrier with a high accuracy.

In one embodiment of the invention, there is a method for the depth-resolved characterization of a layer of a carrier. This involves firstly producing a cutout in the layer of the carrier with a sidewall and subsequently removing carrier material adjoining the sidewall with the aid of an ion beam. During the removal process, images of the sidewall are recorded and material compositions of the removed carrier material are determined as well. A depth-resolved characterization of the layer of the carrier is carried out on the basis of a correlation of the determined material compositions of the removed carrier material with the recorded images of the sidewall, layer depths being assigned to the material compositions of the removed carrier material with the aid of the images of the sidewall.

The invention affords a possibility of characterizing a layer of a carrier in depth-resolved fashion with a high accuracy. In this case, the accuracy of the method is based on producing images of the sidewall during the removal process and thus obtaining height or depth information from an edge which adjoins the sidewall and migrates downward on account of the material removal. Layer depths can be assigned to the respectively determined material compositions very precisely in this way. Different removal speeds caused by different material compositions in different depths consequently have no influence on the accuracy of the characterization.

Furthermore, the carrier is locally destroyed by the removal process in a limited region. If the carrier is a wafer, the latter can be processed further after the method according to the invention has been carried out. Consequently, the method according to the invention is also suitable for the "inline" measurement of product wafers.

In one preferred embodiment, the sidewall of the cutout essentially runs perpendicularly to a surface of the carrier. This embodiment enables a high lateral spatial resolution of the method. If the ion beam is likewise essentially oriented perpendicularly to the carrier surface and carrier material is therefore removed in a small lateral region adjoining the sidewall, the lateral spatial resolution of the method is improved further.

In a further preferred embodiment, the carrier material is removed with the aid of a pulsed ion beam. As a result of this, the removal process is subdivided into "removal events" that are temporally separate from one another, as a result of which the material compositions of the removed carrier material can be determined in temporally resolved fashion very accurately. This enables a particularly exact correlation of the material compositions determined with the recorded images of the sidewall, as a result of which the depth resolution of the method can be improved further.

The carrier material removed by the ion beam also contains a certain proportion of ionized particles in addition to neutral particles. In accordance with a further preferred embodiment, a mass spectrometer is used for determining the material compositions of the removed carrier material, the ionized particles being fed to said mass spectrometer with the aid of an electric field. In this case, the use of a mass spectrometer enables an accurate analysis of the material compositions of the carrier material.

In accordance with a further preferred embodiment, a scanning electron microscope is used for recording the images of the sidewall. In this case, a primary electron beam is directed at the sidewall in particular in the region of the edge which adjoins the sidewall and migrates downward as a result of the removal of carrier material, and the interaction products (secondary electrons, x-rays, etc.) produced by the electrons of the primary electron beam are detected with the aid of a detector for imaging. The images of the sidewall recorded in this way have a high accuracy, as a result of which the layer depths to be assigned to the material compositions of the removed carrier material can be determined accurately.

A positive side effect of the use of a scanning electron microscope is that the primary electron beam brings about an additional ionization of the removed carrier material. Consequently, a large part of, or if appropriate essentially the entire, carrier material is ionized and is therefore accessible to an analysis by mass spectrometry.

As described above, the method can be used for the depth-resolved characterization of a layer of a wafer. In a further preferred embodiment, a profile of a dopant concentration is established in this case.

In still another embodiment of the invention, there is an apparatus for the depth-resolved characterization of a layer of a carrier. The apparatus has a device for producing a cutout in the layer of the carrier with a sidewall, a device for removing carrier material adjoining the sidewall with the aid of an ion beam, a recording device for recording images of the sidewall, and a device for determining material compositions of the removed carrier material during the removal process. Furthermore, provision is made of an evaluation device for the depth-resolved characterization of the layer of the carrier on the basis of a correlation of the determined material compositions of the removed carrier material with the recorded images of the sidewall, layer depths being assigned to the material compositions of the removed carrier material with the aid of the images of the sidewall.

An apparatus of this type correspondingly enables a depth-resolved characterization of a layer of a carrier with a high accuracy and is suitable in particular for the "inline" characterization of a layer of a product wafer.

BRIEF DESCRIPTION OF THE DRAWINGS

The invention is explained in more detail below with reference to the figures, in which:

FIG. 4 shows a preferred embodiment of an apparatus according to the invention for carrying out this method.

DETAILED DESCRIPTION OF THE INVENTION

Figure 1:
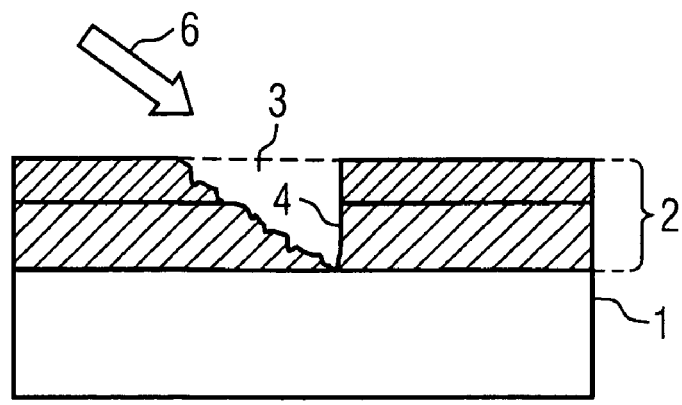
FIGS. 1 to 3 show lateral sectional illustrations of a detail from a wafer on which a preferred embodiment of a method according to the invention for establishing a profile of a dopant concentration is carried out.
Figure 2:
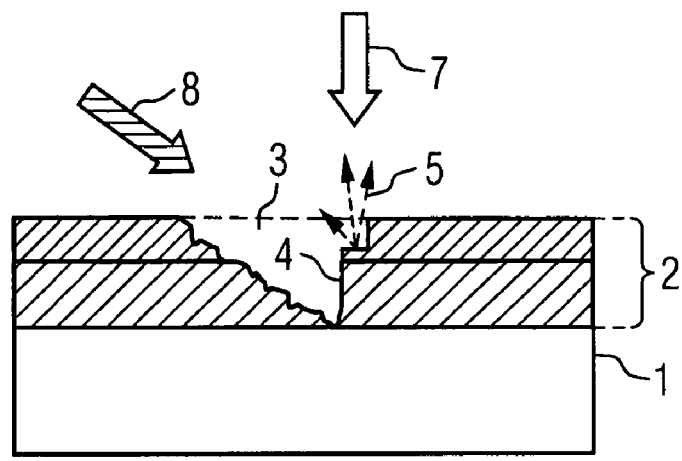
Figure 3:
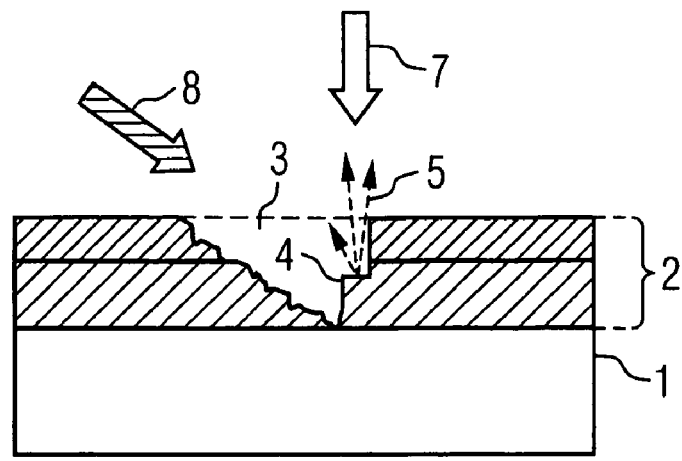

FIGS. 1 to 3 show schematic lateral sectional illustrations of a detail from a wafer 1 on which a preferred embodiment of a method according to the invention is carried out. The method is used for determining a (depth) profile of a dopant concentration of the wafer 1 in order subsequently to supervise doping processes carried out on the wafer 1. On account of the doping processes, the wafer 1 has a doped layer 2 extending into the depth from the surface, which doped layer is divided for example into two partial regions with different dopant concentrations that are arranged one above the other. The partial regions of the layer 2 are identified by different hatching in FIGS. 1 to 3.

At the beginning of the method, as shown in FIG. 1, a preferably wedge- or V-shaped cutout 3 is produced in the layer 2 of the wafer 1 with the aid of a focused ion beam 6 directed onto the surface of the wafer 1 or of the layer 2 at an oblique angle of incidence. The cutout 3 has a sidewall 4 preferably running essentially perpendicularly to the surface of the wafer 1.

As an alternative, there is the possibility of producing a differently shaped cutout. It is also optionally possible to realize a side edge running obliquely with respect to the wafer surface.

Afterward, as illustrated in FIGS. 2 and 3, semiconductor material 5 is removed adjoining the sidewall 4 with the aid of a preferably pulsed ion beam 7. As a result of the material removal, the sidewall 4 is removed stepwise from top to bottom, while an edge formed at the sidewall 4 progressively migrates downward. The pulses of the ion beam 7 preferably have a time duration of approximately 500 ns. As an alternative, it is possible to use a continuous ion beam for the removal of semiconductor material.

The pulsed ion beam 7 is oriented essentially perpendicularly to the wafer surface in accordance with the sidewall 4. Consequently, the semiconductor material 5 is removed in a limited lateral region adjoining the sidewall 4.

During the removal process, the removed semiconductor material 5 is examined with regard to its material composition in order to determine dopant concentrations. This is done by using a mass spectrometer (not illustrated in FIGS. 1 to 3), which enables an accurate analysis of the particles of the semiconductor material 5 and thus of the respective material compositions. On account of the pulsed ion beam 7, a certain proportion of the particles of the semiconductor material 5 is ionized. These ionized particles are fed to the mass spectrometer with the aid of an electric field and are separated and detected there according to the quotient of mass and charge.

At the same time during the removal process images of the sidewall 4 are recorded at a viewing angle in an angular range of between 30° and 60°, preferably at a viewing angle of 45°. The height of the edge which adjoins the sidewall 4 and also "migrates" downward as a result of the material removal can in each case be gathered from said images. The layer depth from which the respectively removed semiconductor material 5 originates can be determined in this way.

A scanning electron microscope (not illustrated in FIGS. 2 and 3) is used for recording the images of sidewall 4. By means of the scanning electron microscope, a (primary) electron beam 8 is directed onto the sidewall 4 in particular in the region of the edge adjoining the sidewall 4, and the interaction products, in particular ejected secondary electrons, produced in the irradiated region are detected by means of a detector for imaging (not illustrated). In this way, it is possible to obtain accurate images of the sidewall 4 during the removal process, in particular upon each "removal event" caused by a pulse of the ion beam 7 and correspondingly to determine very exactly the layer depths associated with the removal events.

The use of the scanning electron microscope furthermore has the consequence that the particles of the removed semiconductor material 5 are additionally ionized by the electron beam 8. Consequently, a large part of, or essentially the entire, semiconductor material 5 is ionized and can be fed to the mass spectrometer for analysis.

In order to establish a profile of a dopant concentration of the layer 2 of the wafer 1, the material compositions or dopant concentrations of the removed semiconductor material 5 which are determined upon each pulse or upon each removal event are correlated with the respectively recorded images of the sidewall 4. In this case, layer depths are assigned to the determined dopant concentrations with the aid of the images of the sidewall 4 as described above.

Since the semiconductor material 5 is removed in a limited lateral region, the method is distinguished by a high lateral spatial resolution. In this case, the lateral spatial resolution is essentially prescribed by the geometrical extent of the ion beam 7 present in the removal region and is preferably approximately 50 nm.

Consequently, there is the possibility of determining, in a targeted manner, a doping profile or else a depth profile of a material composition in a limited region in which only a single microelectronic semiconductor component is realized. In this case, too, the use of the scanning electron microscope proves to be particularly favorable in order, on the one hand, to exactly localize such a region before the method according to the invention is carried out and, on the other hand, to direct the ion beams 6, 7 precisely onto such a region.

With regard to laterally delimited semiconductor components or else structures which are formed in a surface layer of the wafer 1 and the structure elements of which have a smaller lateral extent than the geometrical extent of the ion beam 7, it is preferable for the correlation of the determined material compositions of the removed semiconductor material 5 with the recorded images of the sidewall 4 to be based on a geometrical model of the semiconductor component or structure. A precise lateral assignment of the material compositions determined to the individual structure elements is made possible in this way.

Furthermore, the method is distinguished by a very high depth resolution, preferably having a value of about 1 to 5 nm, on account of the temporally resolved material removal brought about by the pulsed ion beam 7 and the correlation of said material removal with the scanning-electronically recorded images of the sidewall 4. The method can furthermore be used for establishing a profile of a dopant concentration of the wafer 1 to a depth of a plurality of μm provided that a correspondingly deep cutout 3 is produced in the wafer 1.

Gallium ion beams are preferably used as ion beams 6, 7 for carrying out the method. As an alternative, there is also the possibility of using cesium or argon ions, for example.

FIG. 4 shows a schematic illustration of a preferred embodiment of an apparatus 10 according the invention which can be used to carry out the method—explained with reference to FIGS. 1 to 3—for determining a profile of a dopant concentration over the layer depth of a layer 2 of a wafer 1.

The apparatus 10 has a device 17 for emitting a continuous ion beam 6 and a pulsed ion beam 7. With the aid of the ion beam 6, which is directed obliquely onto a surface of the wafer 1 (not illustrated in FIG. 4), a V-shaped cut out 3 is produced in the layer 2 of the wafer 1 with a sidewall 4 running essentially perpendicularly to the wafer surface. The pulsed ion beam 7, which is oriented essentially perpendicularly to the wafer surface, is used for removing carrier material 5 adjoining the sidewall 4. In order to carry out these removal processes that are performed from different directions relative to the wafer surface, either the wafer 1 itself is rotated or the device 17 is rotated around the wafer 1.

The apparatus 10 further has a device 18 for emitting a (primary) electron beam 8 onto the sidewall 4 and also a detector 19 for detecting the interaction products, in particular ejected secondary electrons 9 produced by the electrons of the electron beam 8. The device 18 and the detector 19 represent the essential components of a scanning electron microscope which is used for recording images of the sidewall 4 during the removal process carried out with the aid of the pulsed ion beam 7.

The apparatus 10 furthermore has a mass spectrometer 15, which is used to determine the material compositions and in particular the dopant concentrations of the removed semiconductor material 5 during the removal process. In this case, with the aid of an electric field, that proportion of the semiconductor material 5 which is ionized by the ion beam 7 and the electron beam 8 is fed to the mass spectrometer 15, where it is subjected to an analysis.

Furthermore, an evaluation device 11 is provided, which is used for the correlation of the material compositions— determined by mass spectrometry—of the removed carrier material 5 with the scanning-electronically recorded images of the sidewall 4 and thus for the depth-resolved characterization of the layer 2 of the wafer 1. In this case, layer depths are assigned to the material compositions of the carrier material 5 with the aid of the images of the sidewall 4. In this way, in particular a profile of a dopant concentration of the layer 2 of the wafer 1 is determined with a high lateral spatial resolution and a high depth resolution.

The methods according to the invention explained with reference to the figures and also the apparatus according to the invention are not only suitable for determining a profile of dopant concentration of a wafer. The method and the apparatus can generally be used to establish a depth profile of the material compositions of a layer of a carrier and thereby to characterize the carrier in depth-resolved fashion.

LIST OF REFERENCE SYMBOLS

1 Wafer
2 Layer
3 Cutout
4 Sidewall
5 Semiconductor material
6, 7 Ion beam
8 Electron beam
9 Secondary electrons
10 Apparatus
11 Evaluation device
15 Mass spectrometer
17 Device
18 Device
19 Detector

What is claimed is:

1. A method for the depth-resolved characterization of a layer of a carrier, comprising:
   producing a cutout in the layer of the carrier with a sidewall;
   removing carrier material adjoining the sidewall with aid of an ion beam;
   recording images of the sidewall during the removal process;
   determining material compositions of the removed carrier material during the removal process;
   depth-resolved characterizing the layer of the carrier based on a correlation of the determined material compositions of the removed carrier material with the recorded images of the sidewall, wherein layer depths are assigned to the material compositions of the removed carrier material with aid of the images of the sidewall.

2. The method as claimed in claim 1, wherein the cutout is produced with aid of an ion beam.

3. The method as claimed in claim 1, wherein the sidewall essentially runs perpendicular to a surface of the carrier.

4. The method as claimed in claim 3, wherein the carrier material is removed with aid of a pulsed ion beam in the removal of the carrier.

5. The method as claimed in claim 4, wherein the pulses have a time duration of approximately 500 ns.

6. The method as claimed in claim 5, wherein a mass spectrometer is used in depth-resolved characterizing for determining the material compositions of the removed carrier material.

7. The method as claimed in claim 6, wherein a scanning electron microscope is used in recording images of the sidewall.

8. The method as claimed in claim 7, wherein the images of the sidewall are recorded at a viewing angle in an angular range of between 30° and 60°.

9. The method as claimed in claim 8, wherein a profile of a dopant concentration is established during the depth-resolved characterizing.

10. The method as claimed in claim 9, wherein a gallium ion beam is used.

11. An apparatus for the depth-resolved characterization of a layer of a carrier, comprising:
   a first device for producing a cutout in the layer of the carrier with a sidewall;
   a second device for removing carrier material adjoining the sidewall with aid of an ion beam;
   a recording device for recording images of the sidewall during the removal process;
   a third device for determining material compositions of the removed carrier material during the removal process; and
   an evaluation device for the depth-resolved characterization of the layer of the carrier based on a correlation of the determined material compositions of the removed carrier material with the recorded images of the sidewall, wherein layer depths are assigned to the material compositions of the removed carrier material with aid of the images of the sidewall.

* * * * *